United States Patent
Asano

(10) Patent No.: US 6,466,595 B2
(45) Date of Patent: Oct. 15, 2002

(54) LASER DIODE DRIVING METHOD AND CIRCUIT WHICH PROVIDES AN AUTOMATIC POWER CONTROL CAPABLE OF SHORTENING THE START-UP PERIOD

(75) Inventor: Hiroaki Asano, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/875,170

(22) Filed: Jun. 7, 2001

(65) Prior Publication Data

US 2002/0009109 A1 Jan. 24, 2002

(30) Foreign Application Priority Data

Jun. 7, 2000 (JP) ........................ 2000-170958

(51) Int. Cl.[7] ................................. H01S 3/13
(52) U.S. Cl. ............................... 372/29.021
(58) Field of Search .................. 372/29.021, 29.02

(56) References Cited

U.S. PATENT DOCUMENTS 5,377,213 A * 12/1994 Honda .................... 372/38
6,037,832 A * 3/2000 Kaminishi ............... 327/538
6,393,041 B1 * 5/2002 Sato ...................... 372/29.021

* cited by examiner

*Primary Examiner*—James Davie
(74) *Attorney, Agent, or Firm*—Connolly Bove Lodge & Hutz LLP

(57) ABSTRACT

A technique for driving a laser diode on the basis of automatic power control (APC) is disclosed. The technique uses, for the bottom level feedback control, a constant reference voltage instead of a variable intermediate signal generated in the peak level feed back control. The constant reference voltage may be either a reference voltage for the peak level control or a separately generated voltage. A technique for setting the extinction ratio to 1/n is also disclosed.

15 Claims, 13 Drawing Sheets

LASER DIODE DRIVING METHOD AND CIRCUIT WHICH PROVIDES AN AUTOMATIC POWER CONTROL CAPABLE OF SHORTENING THE START-UP PERIOD

BACKGROUND OF THE INVENTION

1. Field of the Invention

The invention generally relates to laser diode systems and, more specifically, to a laser diode driver circuit which provides an automatic power control (APC) for a laser diode for use in laser diode systems such as a photo pickup, an optoelectronic transceiver, etc.

2. Description of the Prior Art

As is well known in the art, the laser diode changes in the driving current-to-optical output power characteristic due to temperature variation or aging. For this reason, there have been proposed various techniques of feedback controlling the current flowing through a laser diode on the basis of an error or difference between a reference value and a detected value of the optical output power emitted by the laser diode so as to keep constant the extinction ratio, i.e., the ratio between the maximum output power at the time of light emitting operation of the laser diode and the minimum output power at the time of light extinguishing operation of the laser diode. Hereinafter, the level of the maximum output power, which corresponds to binary ones, is referred to as the peak level; and the level of the minimum output power, which corresponds to binary zeros, is referred to as the bottom level.

One of such techniques is disclosed, for example, in Japanese patent publication No. 2,856,247 (1998). FIG. 1 is a diagram showing the arrangement of a prior art laser diode (LD) driving circuit 0 of the APC method disclosed in the publication. In FIG. 1, the LD driving circuit comprises: an LD 1; a monitoring photodiode 2 so positioned and oriented as to be optically coupled with LD 1 to produce a photo-current Ipd; a current-to-voltage (C/V) converter 3 for converting the photo-current Ipd into a detected voltage Vo, which is directly proportional to the optical power transmitted by LD 1; a peak error detector 4 for providing a peak error signal indicative of the error or difference between a peak reference voltage Vpeak and each peak value Vop of the detected voltage Vo; a bottom error detector 5 for providing a bottom error signal indicative of the error or difference between a bottom reference voltage Vbottom and each bottom value Vob of the detected voltage Vo; a bias current driver 9 for supplying LD 1 with a bias current Ib of a level for an extinction operation of LD 1; and a modulation current driver 8 for supplying LD 1 with a modulation current Im which, together with the bias current Ib, constitutes a driving current at the time of a light emitting operation of LD 1.

Bias current driver 9 comprises a current source 91 having a control input terminal, which is supplied with the bottom error signal from the bottom error detector 5, and accordingly having a capability of providing a bias current Ib variable in response to the bottom error signal. Modulation current driver 8 comprises: a differential pair of transistors 81 and 82 having their gates supplied with a differential pair of modulation signals Data and $\overline{\text{Data}}$ and having their drains connected with the cathode terminal of LD1 and the power supply Vcc, respectively; and a current source 83 having its take-in terminal connected with the source terminals of transistors 81 and 92, its output terminal coupled to the ground, and its control input terminal supplied with the peak error signal from the peak error detector 4, thereby to be capable of causing a current Ip variable in response to the peak error signal. Since modulation current driver 8 causes the current Ip to flow through LD1 only when the modulation signal Data is high or logical "1", a modulation signal Data of a low level or logical "0" will cause a driving current Ib to flow through LD 1 thereby to cause LD 1 to be inactive, and a modulation signal Data of the high level or logical "1" will cause a driving current Ib+Ip to flow through LD 1 thereby to cause LD 1 to radiate an optical energy. It is noted that the differential modulation signals Data and $\overline{\text{Data}}$ are a pair of binary signals which change in a complementary manner between a higher level and a lower but non-zero level as shown by the two upper graphs in FIG. 13.

A portion of the optical energy emitted from LD 1 is detected by photodiode 2 as a photo-current Ipd, which is converted by C/V converter 3 into a voltage Vo proportional to the emitted optical energy. The voltage Vo is supplied to the above-mentioned peak 4 and bottom 5 error detectors.

The peak error detector 4 comprises: a peak hold circuit 41 for detecting and holding the peak level Vop of the output voltage Vo from C/V converter 3; an operational amplifier 42; and a feed-back resistor 43 connected between the output terminal and the inverting input terminal of op-amp 42. The non-inverting input terminal of op-amp 42 is connected with the node between serially connected resistors 11 and 12 spanning the power supply potential Vcc and the ground thereby to be supplied with a reference voltage Vpeak. Op-amp 42 has its inverting input terminal further coupled with the peak hold circuit 41 output Vop and its output terminal further connected with the control input of the current source 83 within modulation current driver 8 so as to supply a peak error signal based on the difference between the peak level Vop and the reference voltage Vpeak to the current source 83 control input. The magnitude of the current Ip which modulation current driver 8 flows through LD 1 is controlled such that the peak level (or envelope) Vop of the C/V converter 3 output Vo matches the reference voltage Vpeak, i.e., the peak error signal from op-amp 42 becomes zero in the level.

The bottom error detector 5 comprises: a bottom hold circuit 51 for detecting and holding the bottom level Vob of the output voltage Vo from C/V converter 3; an operational amplifier 52; and a feed-back resistor 53 connected between the output terminal and the inverting input terminal of op-amp 52. The non-inverting input terminal of op-amp 52 is connected with the node between serially connected resistors 13 and 14 spanning the peak hold circuit 41 output Vop and the ground thereby to be supplied with a reference voltage Vbottom. Op-amp 52 has its inverting input terminal also coupled with the bottom hold circuit 51 output Vob and its output terminal also connected with the control input of the current source 91 within bias current driver 9 so as to supply a bottom error signal based on the difference between the bottom level Vob and the reference voltage Vbottom to the current source 91 control input. The magnitude of the bias current Ib which bias current driver 8 flows through LD 1 is controlled such that the bottom level Vob of the C/V converter 3 output Vo matches the reference voltage Vbottom, i.e., the bottom error signal from op-amp 52 becomes zero in the level.

In this way, the prior art LD driver provides such a control as continuously maintains constant peak and bottom output optical powers (or a constant extinction ratio) of LD 1 by changing the modulated current Ip and the bias current Ib supplied to LD 1 in response to the photo-current Ipd detected by photodiode 2.

However, in the prior art LD driver, the bottom level or envelope of the output optical power emitted by LD 1 (i.e., the bias current Ib flowed by current source 91 of bias current driver 9) is controlled to be constant on the basis of the reference voltage Vbottom into which the peak level Vop of the C/V converter 3 output Vo is divided. For this reason, it is only after the stabilization of the peak level of the output optical power of LD 1 (or the C/V converter 3 output Vo) that the bottom level of the output optical power (or the bottom reference voltage Vbottom) can be stabilized. Thus, the prior art LD driver has a problem of taking a significant start-up time till the bottom level of output optical power reaches a stable or stationary state.

Also, generally speaking, the efficiency of optical coupling between LD 1 and photodiode 2 can vary in such a wide range such that the maximum coupling efficiency is on the order of ten times the minimum. A lower coupling efficiency causes the photo-current Ipd from photodiode 2 to become smaller, thereby lowering the peak level Vop of the C/V converter 3 output Vo which level is used as the reference for generating the bottom reference voltage Vbottom. Thus, the prior art LD driver still has a problem that if the peak level Vop is small, then the bottom reference voltage Vbottom becomes small, resulting in the bottom level of the output optical power including a larger error.

It is an object of the invention to provide a laser diode driving method and circuit which provides an automatic power control capable of quickly establishing a desired peak level and a desired bottom level of the output optical power of the laser diode with a raised precision.

It is another object of the invention to provide a laser diode system or circuit incorporating such the laser diode driving method and circuit.

It is noted that, in this document, a term "laser diode system or circuit" means a system or circuit including a laser diode and a driving circuit for the laser diode.

SUMMARY OF THE INVENTION

According to the present invention, a laser diode system for emitting a predetermined optical power in response to an input binary signal is provided. The laser diode system comprises: a laser diode, responsive to a driving current applied thereto, for emitting an optical power; a bias current driver for always providing the laser diode with a bias current of a magnitude responsive to a bias control signal; a modulation current driver, responsive to a predetermined level of the input binary signal, for providing a radiation current of a magnitude responsive to a radiation control signal so as to feed the laser diode with the bias current and the radiation current simultaneously; a photodiode, optically coupled with the laser diode, for generating a photo-current proportional to the optical power from the laser diode; a current-to-voltage converter for providing a detected signal or voltage proportional to the optical power from the laser diode; a peak error detector for supplying the bias current driver with the radiation control signal so as to cause a peak level of the detected signal to match a first (or peak) constant reference voltage, the first constant reference voltage being such that a simultaneous application of the bias and radiation currents to the laser diode causes the laser diode to emit the predetermined optical power; a bottom reference voltage generator for generating a second constant reference voltage from the first constant reference voltage; and bottom error detector for supplying the bias means with the bias control signal so as to cause a bottom level of the detected signal to match the second constant reference voltage, the second constant reference voltage being such that the bias current causes the laser diode to emit no laser.

In one embodiment, the bottom reference voltage generator uses a maximum reference voltage instead of the first constant reference voltage. An AGC circuit may be inserted between the current-to-voltage converter and the bottom error detector so as to cause the peak level of a scaled detected signal to match the second constant reference voltage.

BRIEF DESCRIPTION OF THE DRAWING

The features and advantages of the present invention will be apparent from the following description of an exemplary embodiment of the invention and the accompanying drawings, in which.

Throughout the drawing, the same elements when shown in more than one figure are designated by the same reference numerals.

DETAILED DESCRIPTION OF THE PREFERRED EMBODIMENTS

Figure 1:
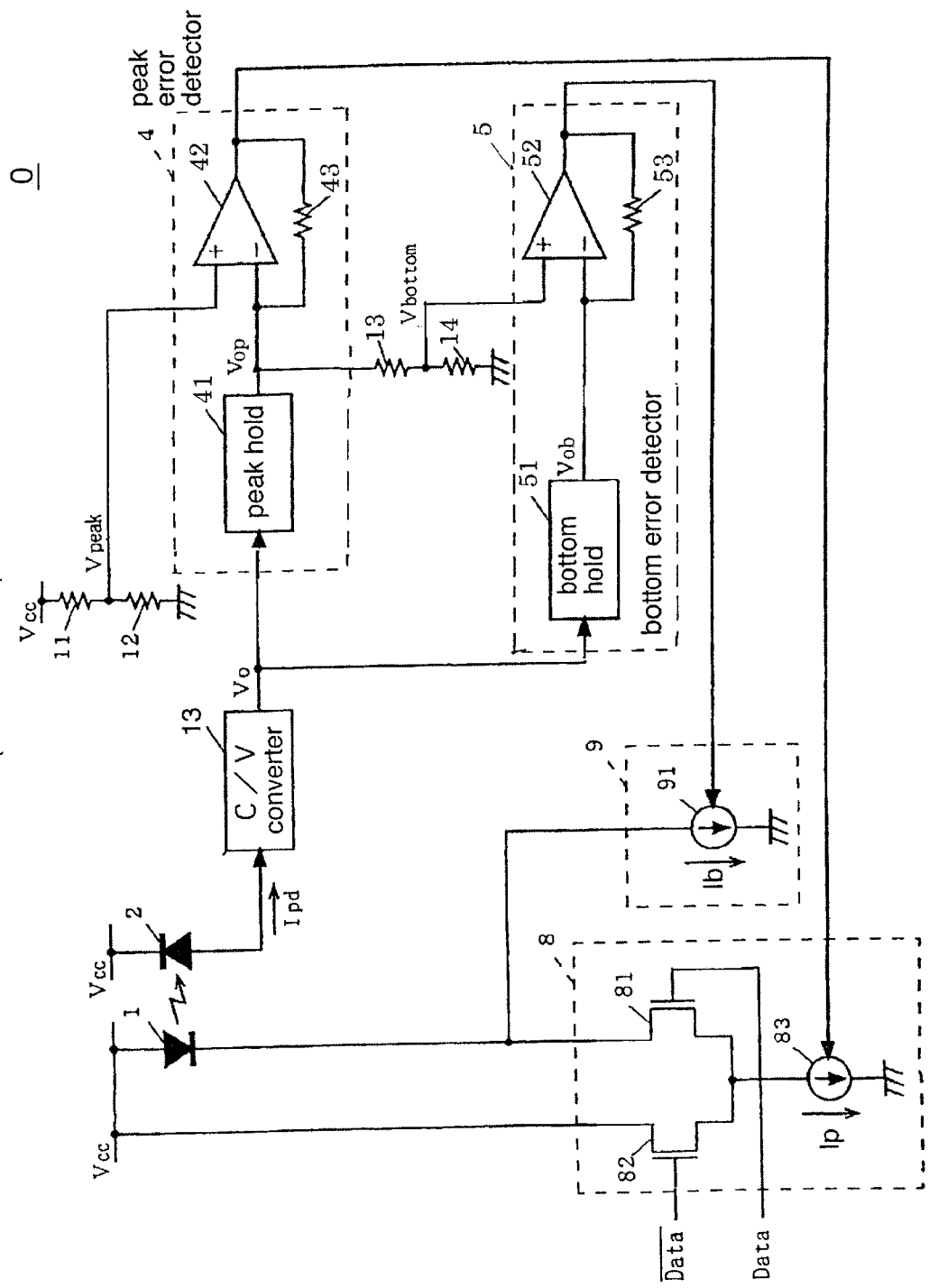
FIG. 1 is a diagram conceptually showing the arrangement of a prior art laser diode (LD) circuit 0 based on the automatic power control (APC)
Figure 2:
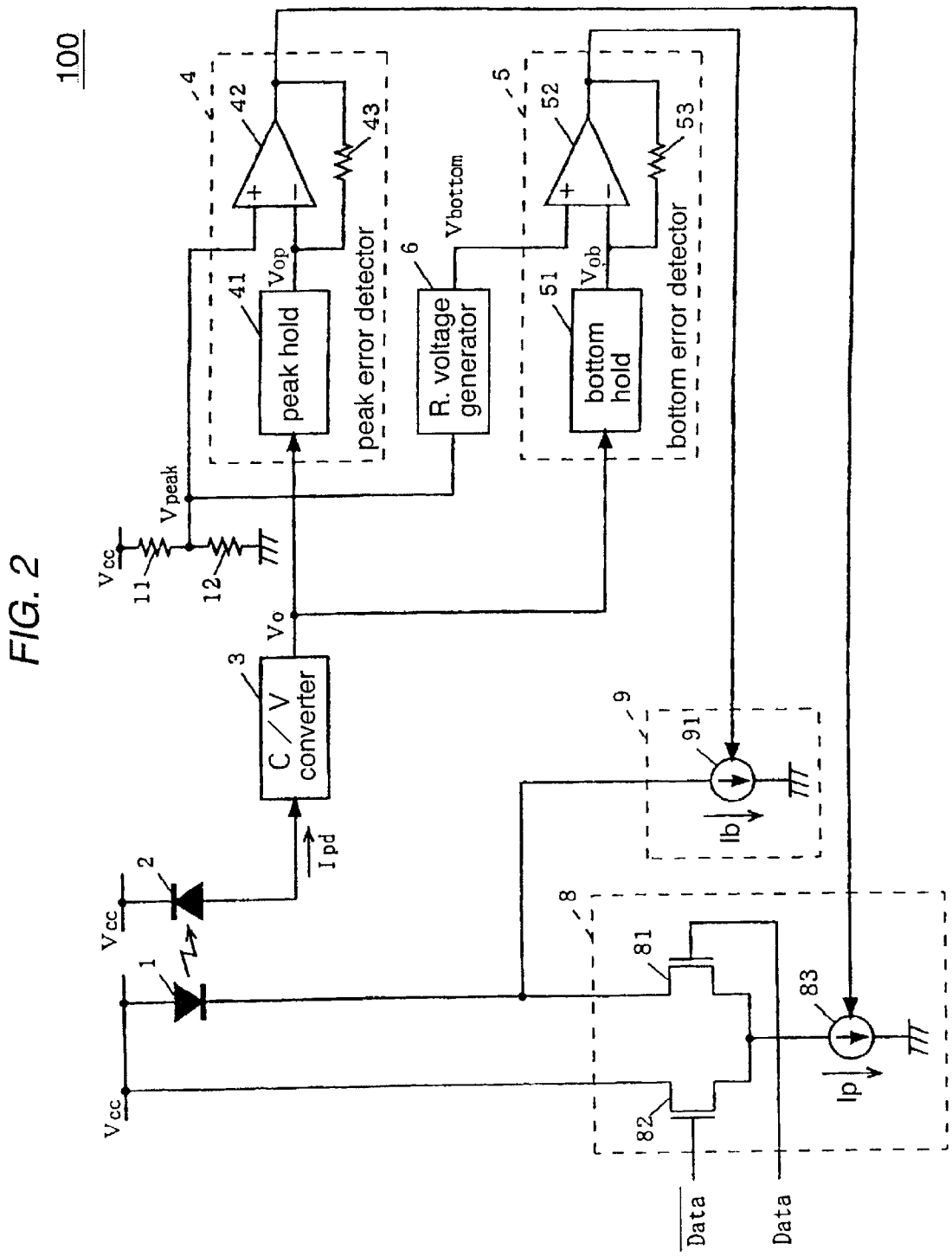
FIG. 2 is a diagram conceptually showing an exemplary arrangement of a laser diode circuit 100 according to a first illustrative embodiment of the invention.

FIG. 2 is a diagram conceptually showing an exemplary arrangement of a laser diode circuit 100 according to a first illustrative embodiment of the invention. In FIG. 2, the laser diode circuit 100 of the invention differs from the prior art LD driver 0 of FIG. 1 only in that:

(1) the voltage divider (13 and 14) has been replaced by a reference voltage generator 6; and (2) the reference voltage generator 6 utilizes the peal reference voltage Vpeak which is always constant instead of the peak hold 41 output Vop which varies during peak level stabilizing period.

Since bottom reference voltage generator 6 uses a fixed voltage Vpeak instead of a variable voltage Vop, bottom reference voltage generator 6 provides a constant reference voltage Vbottom as detailed later, thereby enabling the peak level stabilization and the bottle level stabilization to be achieved independently in parallel with each other, which results in a reduction of the start-up period of a laser diode system or circuit.

Referring to FIGS. 2 through 6, the bottom reference generator 6 and its related portions are detailed and the description of the remaining portions in common with the prior art LD driver 0 of FIG. 1 is limited to the minimum.

Figure 3:
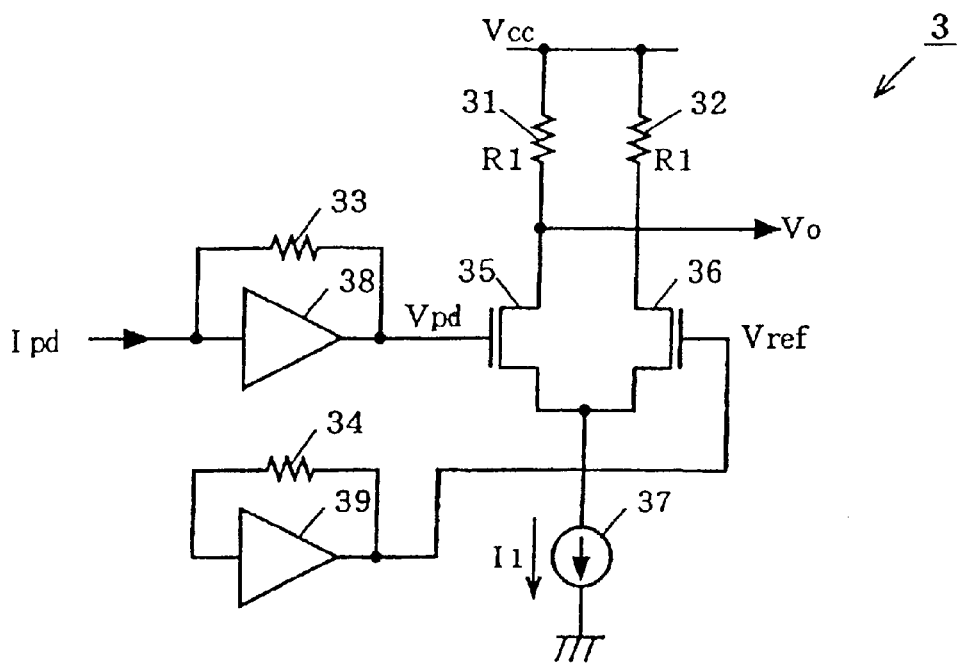
FIG. 3 is a diagram conceptually showing an exemplary arrangement of a C/V converter 3 of the laser diode circuit 100 (FIG. 2)

FIG. 3 is a schematic circuit diagram showing an exemplary arrangement of C/V converter 3 of FIG. 2. In FIG. 2, C/V converter 3 comprises: resistors 31 through 34; a differential pair of transistors 35 and 36; a variable current source 37; and inverting amplifiers 38 and 39. Though transistors 35 and 36 are shown as MOS FETs (metal oxide semiconductor field effect transistors), transistors 35 and 36 may be of any suitable type.

Inverting amplifier 38 and resistor 33 connected in parallel constitute a current-to-voltage converter thereby to convert the input photo-current Ipd detected by photodiode 2 into a corresponding voltage Vpd, which is applied to the gate terminal of transistor 35. On the other hand, parallelly connected inverting amplifier 39 and resistor 34, which also constitute a current-to-voltage converter, supplies the gate terminal of transistor 36 with a voltage Vref the magnitude of which is equal to the voltage Vpd applied to the gate terminal of transistor 35 when the photo-current Ipd is zero. Transistors 35 and 36 share the current I1 of constant current source 37 in response to the ratio between the gate voltages Vpd and Vref. Since transistor 35 (and also 36) has a share ranging from 0 (for Vpd=0 or the maximum Ipd) to I1/2 (for Vpd=Vref or for Ipd=0), the drain terminal of transistor 35 can have a voltage from Vcc to Vcc−R1·I1/2. Thus, the input photo-current Ipd is converted into a voltage Vo ranging from Vcc to Vcc−R1·I1/2 (=Voffset), which is output through the drain terminal of transistor 35. The voltage for Ipd=0; i.e., Voffset (=Vcc−R1·I1/2) is referred to as a DC offset level.

Figure 6:
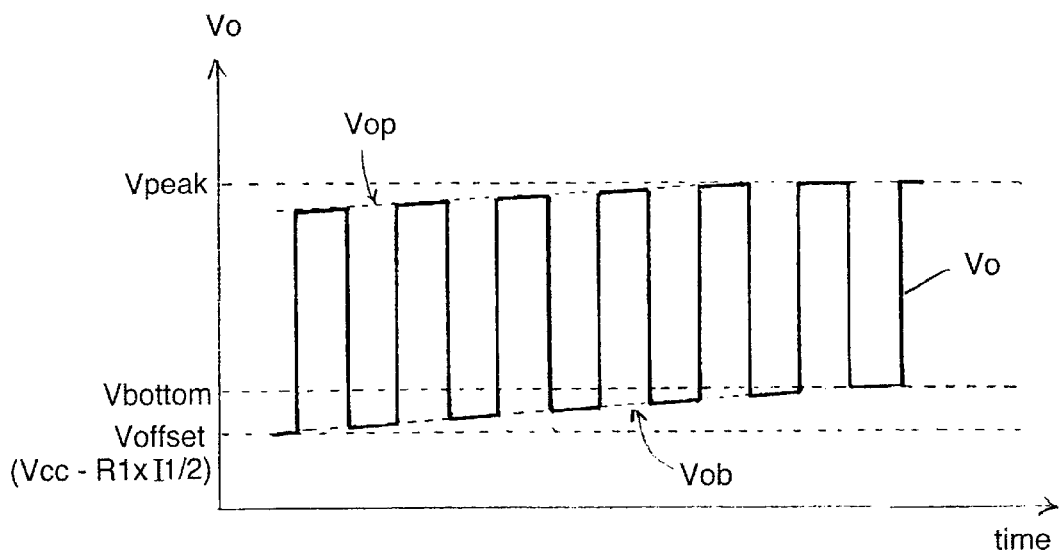
FIG. 6 is a diagram showing a waveform of the C/V converter 3 output Vo to illustrate the concept of the operation of the laser diode circuit 100.

The C/V converter 3 output Vo is supplied to peak hold circuit 41, which detects and holds the peak levels Vop of the signal Vo, which are supplied to the inverting input terminal of operational amplifier 42. Operational amplifier 42 supplies a peak error signal based on the difference between each of the peak levels Vop and the reference voltage Vpeak to the input terminal of the current source 83 within modulation current driver 8. The magnitude of the current Ip which modulation current driver 8 flows through LD 1 is controlled such that the peak levels Vop of the C/V converter 3 output Vo match the reference voltage Vpeak, i.e., the peak error signal from op-amp 42 becomes zero in the level as shown in FIG. 6.

Figure 4:
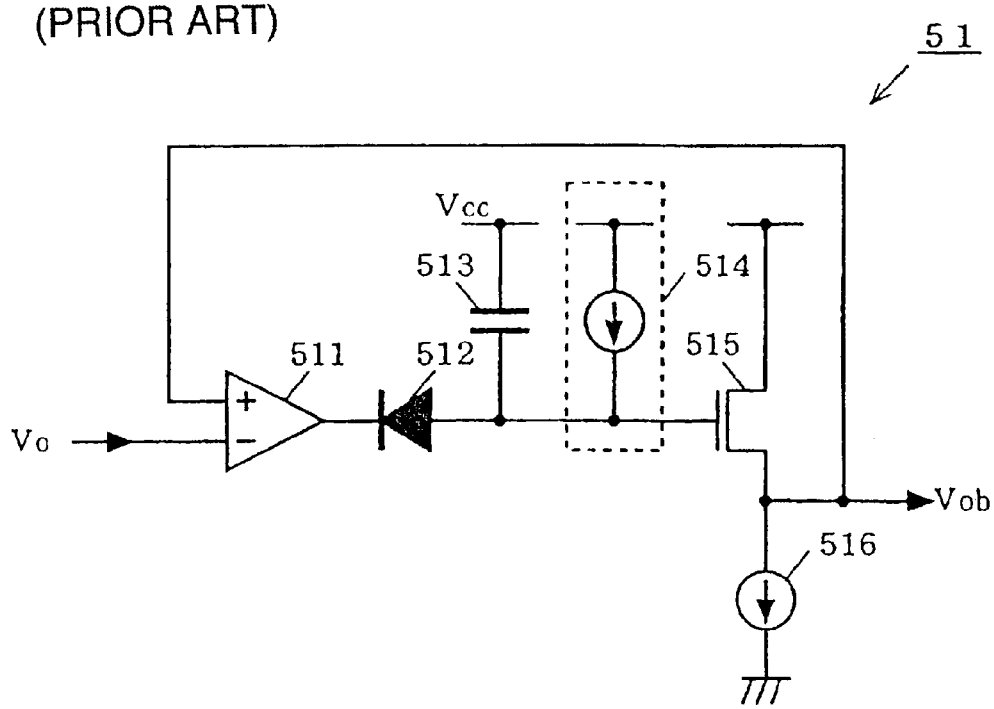
FIG. 4 is a diagram conceptually showing an exemplary arrangement of the conventional bottom hold circuit 51 commonly used in the laser diode circuits 0 (FIG. 1) and 100 (FIG. 2)

On the other hand, the output signal Vo of C/V converter 3 is also supplied to bottom hold circuit 51 of the bottom error detector 5. FIG. 4 is a schematic circuit diagram showing an exemplary arrangement of bottom hold circuit 51 of FIG. 2. In FIG. 4, bottom hold circuit 51 comprises: op-amp 511; a diode 512 having its cathode connected with the op-amp 511 output; a capacitor with one end pulled up to Vcc; a discharger 514 having its anode connected with Vcc; a transistor 515 having its drain pulled up to Vcc and its gate terminal connected with the anode of diode 512, the other end of capacitor 513 and the cathode of discharger 514; and a constant current source 516 having its cathode pulled down to the ground and its anode connected with the source of transistor 515 and the non-inverting input terminal of op-amp 511. Though transistor 515 is shown as a MOS FET, transistor 515 may be of any suitable type. In this configuration, the charging of capacitor 513 is controlled by diode 512 and op-amp 511, and the discharging of capacitor 513 is controlled by discharger 514. The bottom level or envelope Vob of the signal Vo input to the op-amp 511 inverting terminal is held and output at the source terminal of transistor 515. The magnitude of the discharge current supplied by discharger 514 determines the response tracking period for the gradually rising bottom level. Accordingly, the magnitude of the discharge current is preferably set such that a change in the voltage retained across the capacitor 513 is sufficiently large for the maximum duration due to successive identical digits of the possible largest number permitted in the system.

Figure 5:
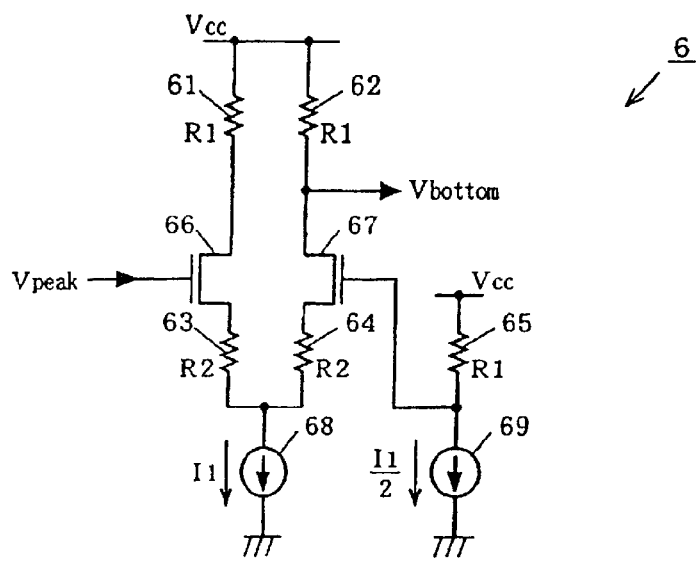
FIG. 5 is a diagram conceptually showing an exemplary arrangement of the reference voltage generator 6 of the laser diode circuit 100 of FIG. 2.

In this way, bottom hold circuit 51 detects and holds the bottom level Vob of the signal Vo, which are supplied to the inverting input terminal of operational amplifier 52. The non-inverting input of op-amp 52 is supplied with a bottom reference voltage Vbottom from the above-mentioned bottom reference voltage generator 6. FIG. 5 is a diagram conceptually showing an exemplary arrangement of reference voltage generator 6 of laser diode circuit 100 of FIG. 2. In FIG. 5, reference voltage generator 6 comprises: a differential pair of transistors 66 and 67 having their drains pulled up to Vcc through respective resistors 61 and 62; a first constant current source 68 having its cathode pulled down to the ground and its anode coupled with the drains of transistors 66 and 67 through respective resistors 63 and 64; and a second constant current source 69 having its cathode pulled down to the ground and its anode pulled up to Vcc through resistor 65. The current value I1 of current source 68 is identical to that of current source 37 of C/V converter 3. The current value of current source 69 is half of the current value I1 of current source 37 of C/V converter 3, i.e., I1/2.

According to the principles of the invention, the gate terminal of transistor 66, which serves as the input terminal of reference voltage generator 6, is coupled with the peak reference voltage Vpeak, which is given, in this specific example, by the node between the voltage-dividing resistors 11 and 12 inserted between the power supply Vcc and the ground. The gate terminal of transistor 69 is supplied with a voltage (Vcc R1·I1/2) determined by current source 69 and resistor 65, i.e., the voltage Voffset which is equal to the DC offset level in C/V converter 3.

Assuming that the mutual conductance between transistors 66 and 67 is expressed as gm, the gain (or amplification factor) β realized by the differential pair of transistors 66 and 67 and resistors 61 through 64 is expressed as:

$$\beta = R1/\{2 \cdot (R2 + 1/gm)\}, \tag{1}$$

where R1 is the value of resistors 61 and 62, and R2 is the value of resistors 63 and 64. The voltage of the drain terminal of transistor 67 is given by:

$$Vbottom=Voffset+\beta(Vpeak\ V\ offset).$$

Accordingly, if the values of resistors 61 through 64 and the mutual conductance gm are so set as to make the amplification factor β equal to 1/n (a value n is determined based on the extinction ratio), then the drain terminal of transistor 67 provides a bottom reference voltage Vbottom defined by the following expression:

$$Vbottom=Voffset+(Vpeak\ V\ offset)/n. \qquad (2)$$

In this way, if the peak reference voltage Vpeak is so set as to be adapted to the peak level of the output optical power of LD 1, setting R1 and R2 to suitable values enables the bottom reference voltage Vbottom to be so set as to make the extinction ratio 1/n. It is noted that since the expression (2) of Vbottom only includes constant values, bottom reference voltage generator 6 can provide the reference voltage Vbottom almost at the same time as the power is turned on, thereby enabling bottom error detector 5 (or more specifically, op-amp 52) to operate in parallel with peak error detector 4 (or more specifically, op-amp 42) immediately after the turning-on of power.

By using thus obtained bottom reference voltage Vbottom, operational amplifier 52 compares the bottom hold circuit 51 output Vob and the voltage Vbottom to provide an error signal to the control input terminal of current source 91 of bias current driver 9. The magnitude of the bias current Ib which bias current driver 8 flows through LD 1 is controlled such that the bottom level Vob of the C/V converter 3 output Vo matches the reference voltage Vbottom as shown in FIG. 6, i.e., the bottom error signal from op-amp 52 becomes zero in the level.

According to the invention, the peak and bottom levels or envelopes of the C/V converter output Vo or the output optical power emitted by LD 1 can be stabilized almost simultaneously as shown in FIG. 6. Accordingly, a laser diode system 100 can shorten the start-up process.

Figure 7:
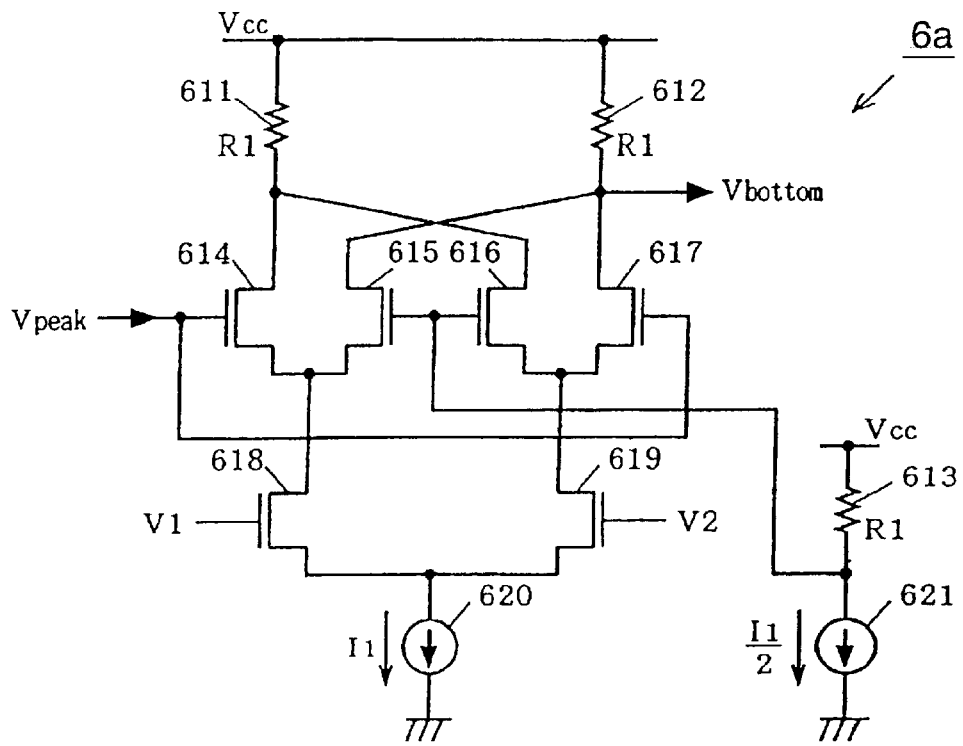
FIG. 7 is a diagram showing an exemplary arrangement of another reference voltage generator 6a that can be substituted for that 6 of FIG. 2.

FIG. 7 is a diagram showing an exemplary arrangement of another bottom reference voltage generator 6a that can be substituted for that 6 of FIG. 2. In FIG. 7, the reference voltage generator 6a comprises: three pairs of transistors 614 and 615, transistors 616 and 617 and transistors 618 and 619; resistors 611 and 612 to pull up the drains of transistors 614 and 617, respectively; a first variable current source 620 having its anode connected with the source terminals of transistors 618 and 619 and its cathode pulled down; a second variable current source 621 having its cathode pulled down and its anode connected with one end of a resistor 613 having the other end pulled up and the gate terminals of transistors 615 and 616. The drain of transistor 615 is connected with the node between resistor 612 and the transistor 617 drain terminal. The drain of transistor 616 is connected with the node between resistor 611 and the transistor 614 drain terminal. The source terminals of transistors 614 and 615 and the transistor 618 drain terminal are connected together. The source terminals of transistors 616 and 617 and the transistor 619 drain terminal are connected together. Though transistors 614 through 619 are shown as MOS FETs, these transistors may be of any suitable type.

The gate terminals of transistors 614 and 617 are coupled with the peak reference voltage Vpeak or the node between the voltage dividing resistors 11 and 12. Assume that the current value of current source 620 is I1 and the current value of current source 621 is half of that of current source 620, i.e., I1/2. Then, the gate terminals of transistors 615 and 616 are supplied with a voltage (Vcc−R1·I1/2), which is equal to the DC offset voltage Voffset in C/V converter 3. If the voltage Vpeak of the gates of transistors 614 and 617 matches the voltage (Voffset) of the gates of transistors 615 and 616, then the mutually connected drains of transistors 615 and 617 yields a voltage equal to Vcc−R1·I1/2. This voltage is referred to as "the second DC offset level", which equals the above-mentioned DC offset level Voffset.

Figure 8:
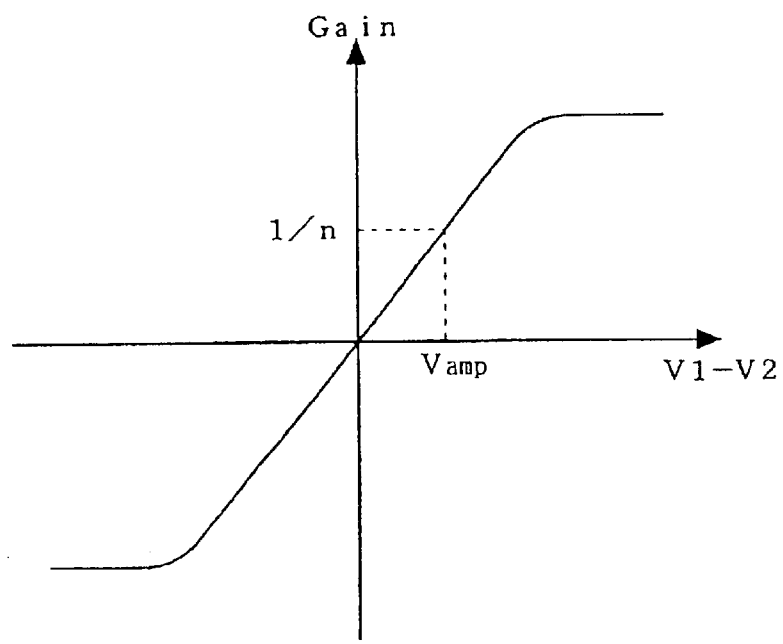
FIG. 8 is a diagram showing the gain characteristic of the reference voltage generator 6a of FIG. 7.

Assuming that the gate terminals of transistors 618 and 619 are given respective voltages V1 and V2, the relationship between the potential difference (V1−V2) between the gate terminals of transistors 618 and 619 and the gain of the bottom reference voltage generator 6a is shown in FIG. 8. In FIG. 8, the axis of abscissas indicates the voltage V1−V2, and the axis of coordinate indicates the gain. As seen from FIG. 8, setting the voltage V1−V2 to an appropriate value Vamp enables the gain of reference voltage generator 6a to be set to 1/n. If the gain is set to 1/n, then the mutually connected drains of transistors 615 and 617 yields a bottom reference voltage Vbottom given by the same expression as in case of FIG. 5; i.e., Voffset+(Vpeak−Voffset)/n.

According to reference voltage generator 6a of FIG. 7, if the peak reference voltage Vpeak has been so set as to be suitable for the peak level of the output optical power, then setting V1 and V2 to suitable values enables the bottom reference voltage Vbottom to be so set as to make the extinction ratio 1/n. It should be noted that even after a laser diode system has been manufactured, setting V1 and V2 to suitable values enables the extinction ratio to be set freely to a desired value.

Figure 9:
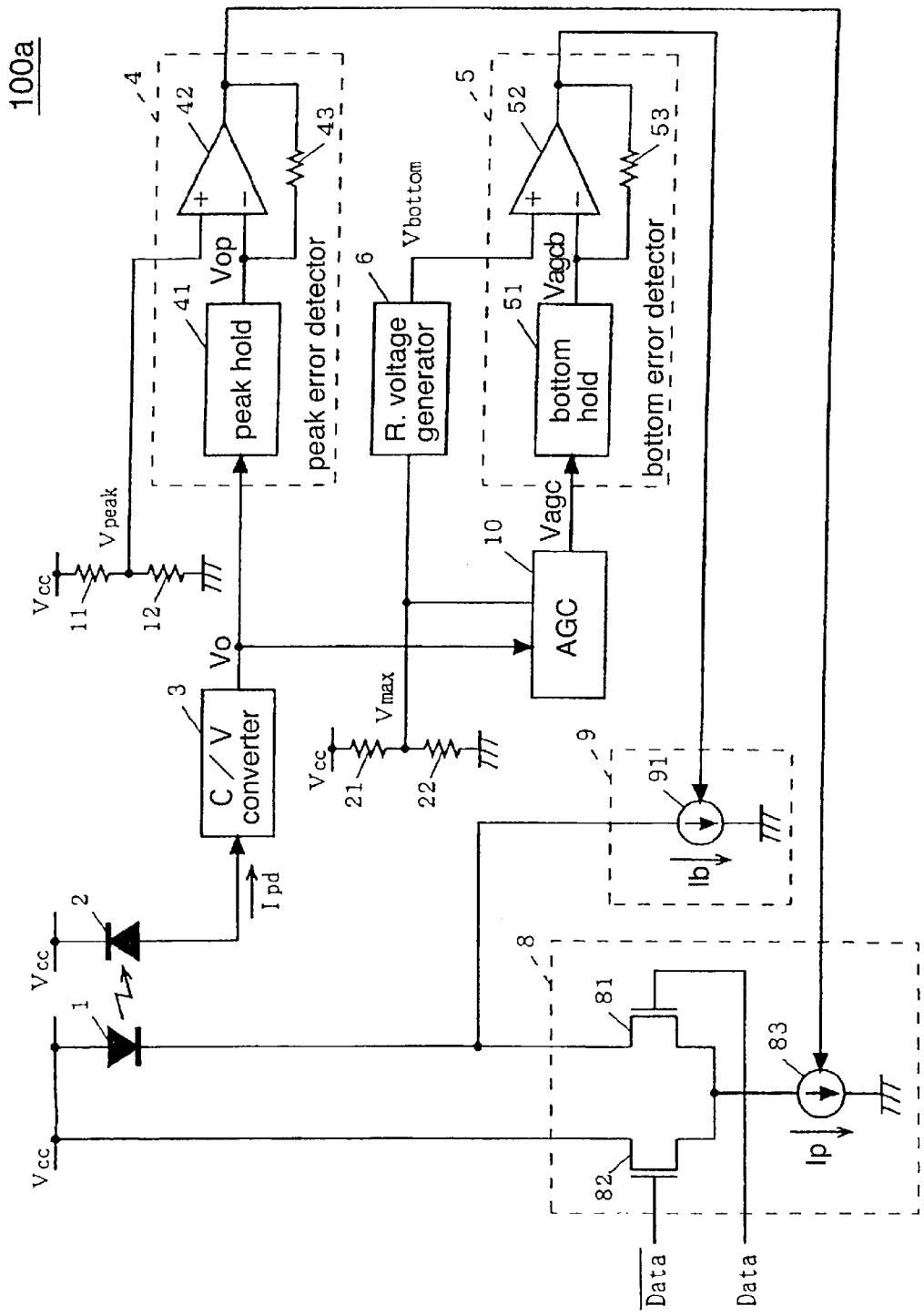
FIG. 9 is a diagram conceptually showing an exemplary arrangement of a laser diode circuit 100a according to a second illustrative embodiment of the invention.

FIG. 9 is a diagram conceptually showing an exemplary arrangement of a laser diode circuit 100a according to a second illustrative embodiment of the invention. In FIG. 9, the laser diode circuit 100a is identical to that of FIG. 2 except that:

(1) a voltage divider (comprised of serially connected resistors 21 and 22 inserted between the power supply Vcc and the ground) has been added to provide a maximum reference voltage Vmax;

(2) the bottom reference voltage generator 6 uses the maximum reference voltage Vmax instead of the peak reference voltage Vpeak; and (3) an automatic gain control (AGC) circuit 10 has been inserted in the path connecting the C/V converter 3 output with the bottom hold circuit 51 input.

The voltage Vmax is also used by the AGC circuit 10. The AGC circuit 10 controls the peak level of the C/V converter 3 output voltage Vo by using the reference voltage Vmax to provide an output signal Vagc the peak level of which equals the voltage Vmax. Using the different reference voltage Vmax other than Vpeak for the determination of bottom level enables the bottom level of the output optical power of LD 1 to be determined in response to the coupling efficiency between LD 1 and photodiode 2.

Since the voltage Vmax is used instead of Vpeak, bottom reference voltage generator 6 outputs a voltage Voffset+ (Vmax−Voffset)/n as the voltage Vbottom to bottom error detector 5 or, more specifically, to the non-inverting input of op-amp 52. Accordingly, if the value of Vmax is set in response to the peak level of the output optical power emitted by LD 1, then the gain of bottom reference voltage generator 6 or 6a can be set to 1/n by appropriately setting the resistor values R1 and R2 or the voltages V1 and V2, respectively, thereby to generate a bottom reference voltage Vbottom adapted for the bottom level of the output optical power of LD 1 in case when the extinction ratio is 1/n.

Figure 10:
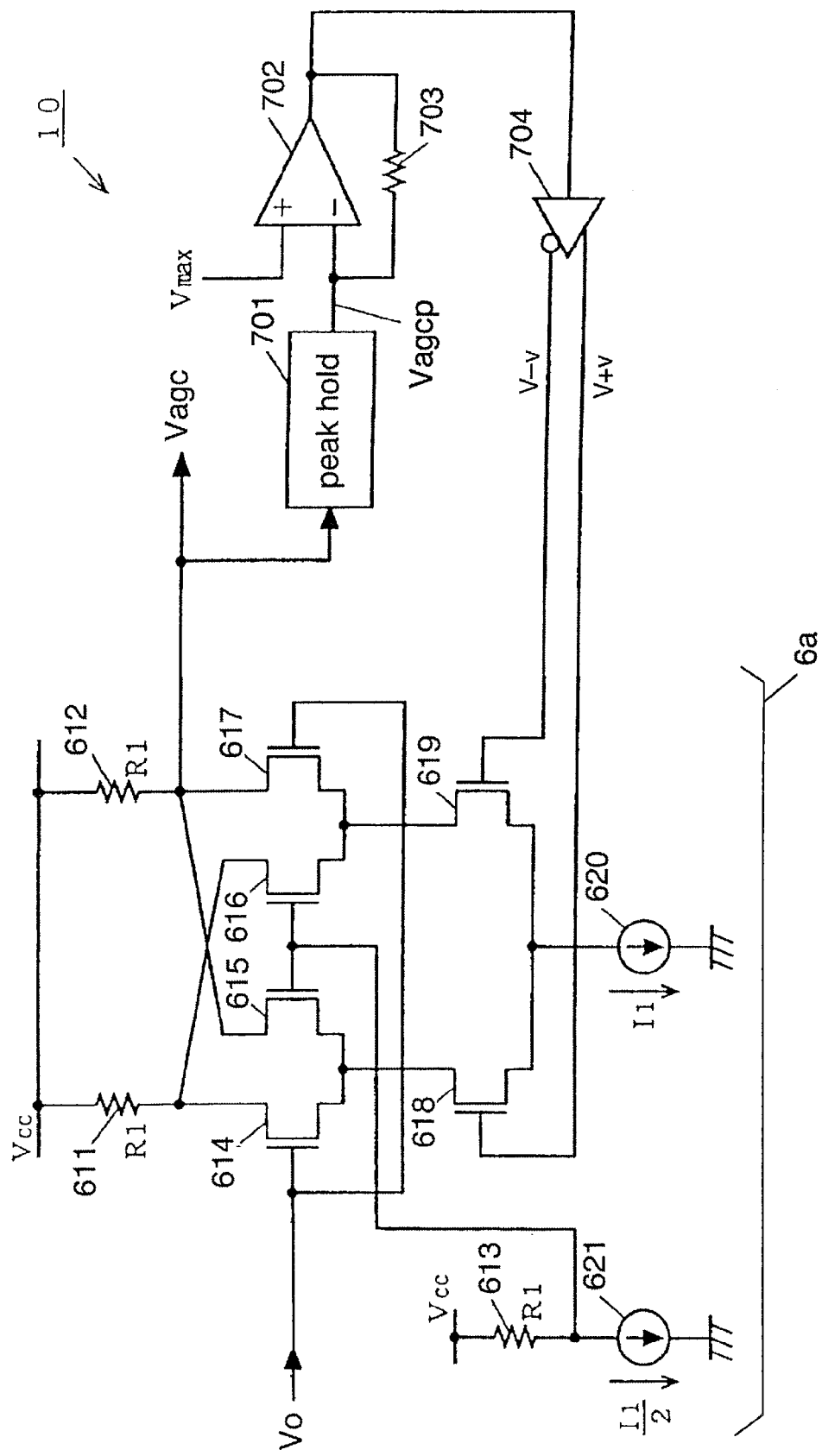
FIG. 10 is a diagram conceptually showing an exemplary arrangement of the AGC circuit 10 of the laser diode circuit 100a of FIG. 9.

FIG. 10 is a schematic circuit diagram showing an exemplary arrangement of AGC circuit 10 of FIG. 9. As seen from comparing FIGS. 10 and 7, AGC circuit 10 is obtained by adding elements 701 through 704 to the bottom reference voltage generator 6a of FIG. 7. Specifically, in FIG. 10, in addition to a circuit portion 6a (identical to FIG. 7), AGC circuit 10 further comprises: a peak hold circuit 701 having its input connected with the node including the transistor 617 drain; an op-amp 702 having its non-inverting input terminal connected with the maximum reference voltage Vmax; a feedback resistor 703 having its one end connected with the peak hold circuit 701 output and the op-amp 702 inverting input terminal; and a buffer circuit 115 having its input terminal connected with the op-amp 702 output and the other end of feedback resistor 703, its in-phase output terminal connected with the gate of transistor 618 and its anti-phase output terminal connected with the gate of transistor 619.

Peak hold circuit 701 is the same as that (denoted by reference numeral 41) of FIGS. 1, 2 and 9. In this case, peak hold circuit 701 detects and holds the peak level (Vagcp) of the voltage (Vagc) given by the node including the drains of transistors 615 and 617. Op-amp 702 compares the voltage Vagcp with the maximum reference voltage Vmax from the voltage divider (21 and 22) to output a feedback value based on the error between Vagcp and Vmax so as to cause the peak level Vagcp to match the reference voltage Vmax. The feedback value is converted into a pair of an in-phase signal V+v and an anti-phase signal V−v. In this case, V is a DC component, and v is a positive variable component proportional to the output value of op-amp 702.

The in-phase V+v and anti-phase signals are applied to the gates of respective transistors 618 and 619. On the other hand, the gate of transistor 614 is supplied with C/V converter 3 output Vo. Though the circuit portion 6a is identical, in configuration, to bottom reference voltage generator 6a of FIG. 7, the former differs from the latter only in input signals and accordingly the output signal. Specifically, in FIG. 10, the signals Vpeak, V1, V2, and Vbottom has been replaced with Vo, V+v, V−v and Vagc. Accordingly, assuming that the gain of the circuit portion 6a is G(v) and replacing Vbottom and Vpeak with Vagc and Vo in expression (2) yields:

$$Vagc = Voffset + (Vo\ V\ offset)G(v), \quad (3)$$

where Voffset is, again, the DC offset level applied to the gates of transistors 615 and 616.

Figure 11:
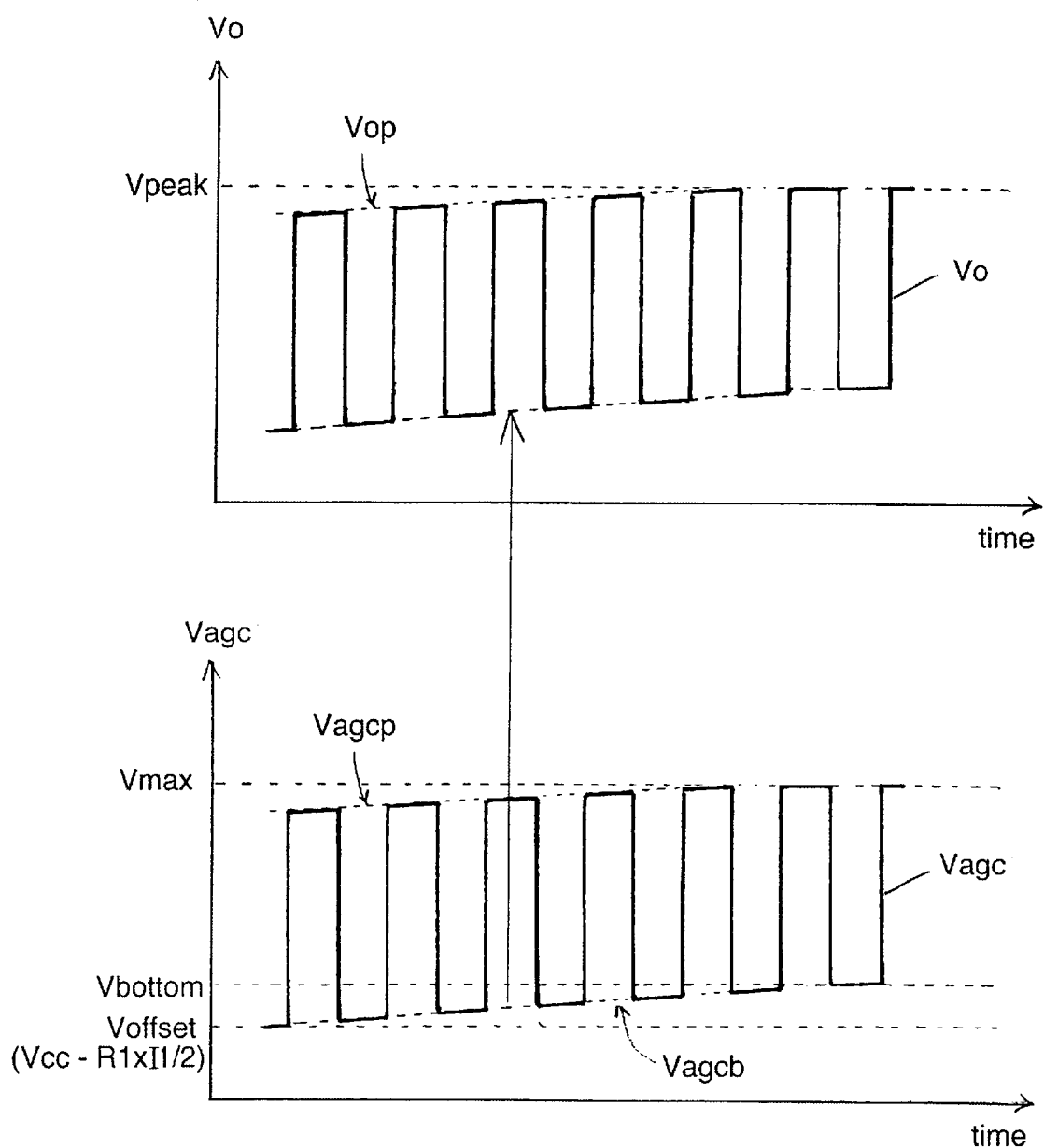
FIG. 11 is a diagram showing waveforms of the C/V converter 3 output Vo and the AGC 10 output Vagc to illustrate the concept of the operation of the laser diode circuit 100.

That is, the commonly connected drains of transistors 615 and 617 provides a voltage Vagc given by expression (3). With the added feedback circuit 701 through 704, the AGC circuit 10 controls the gain of the circuit portion 6a so as to cause the peak level Vagcp of the output voltage Vagc to match the maximum reference voltage Vmax as shown by the upper envelope Vagcp of the waveform of Vagc in the lower graph of FIG. 11. Thus, even if the signal Vo from C/V converter 3 significantly varies due to a change in the efficiency of optical coupling between LD 1 and photodiode 2, the AGC circuit 10 can supply the inverting input of op-amp 52 with a voltage Vagc the upper envelope of which matches the maximum reference voltage Vmax.

Bottom hold circuit 51 detects and holds the bottom level Vagcb of the AGC 10 output voltage Vagc. Then, operational amplifier 52 compares the bottom level Vagcb and the reference voltage Vbottom to provide an error signal to the control input terminal of current source 91 of bias current driver 9. By doing this, the bias current Ib of the current source 91 is controlled such that the bottom level Vageb of the AGC 10 output Vagc matches the reference voltage Vbottom as shown by the bottom envelope of the waveform Vagc in the lower graph of FIG. 11. On the other hand, the peak level Vop of the C/V converter 3 output Vo is so controlled as to match the peak reference voltage Vpeak in the same manner as in case of FIG. 2 or 9 as shown in the upper graph of FIG. 11.

According to the second illustrative embodiment of the invention, the laser diode circuit 100a not only has the same advantages as those of the first illustrative embodiment but also is advantageous in that since the bottom reference voltage Vbottom is generated by using the maximum reference voltage Vmax generated separately from the peak reference voltage Vpeak, the voltage Vbottom always remains constant without being influenced by the efficiency of optical coupling between LD 1 and photodiode 2, which enables a precise convergence of the bottom level of the output optical power to a desired level (i.e., actually, a precise convergence of the bottom level Vagcb of the AGC 10 output Vagc to the bottom reference voltage Vbottom).

Figure 12:
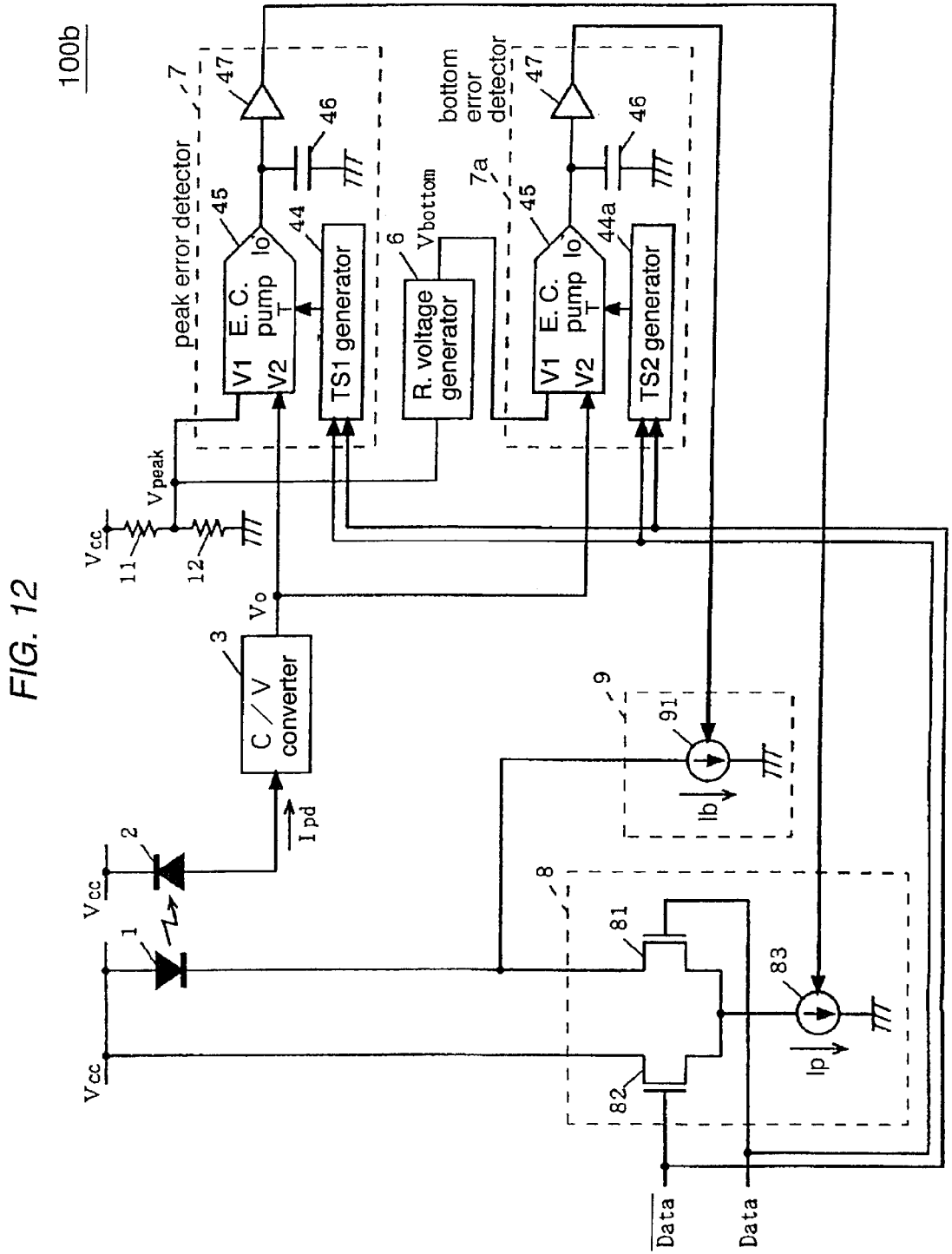
FIG. 12 is a diagram conceptually showing an exemplary arrangement of a laser diode circuit 100b according to a third illustrative embodiment of the invention.

FIG. 12 is a diagram conceptually showing an exemplary arrangement of a laser diode circuit 100b according to a third illustrative embodiment of the invention. In FIG. 12, laser diode circuit 100b is identical to that of FIG. 2 except that peak error detector 4 and bottom error detector 5 have been replaced with peak error detector 7 and bottom error detector 7a.

Figure 13:
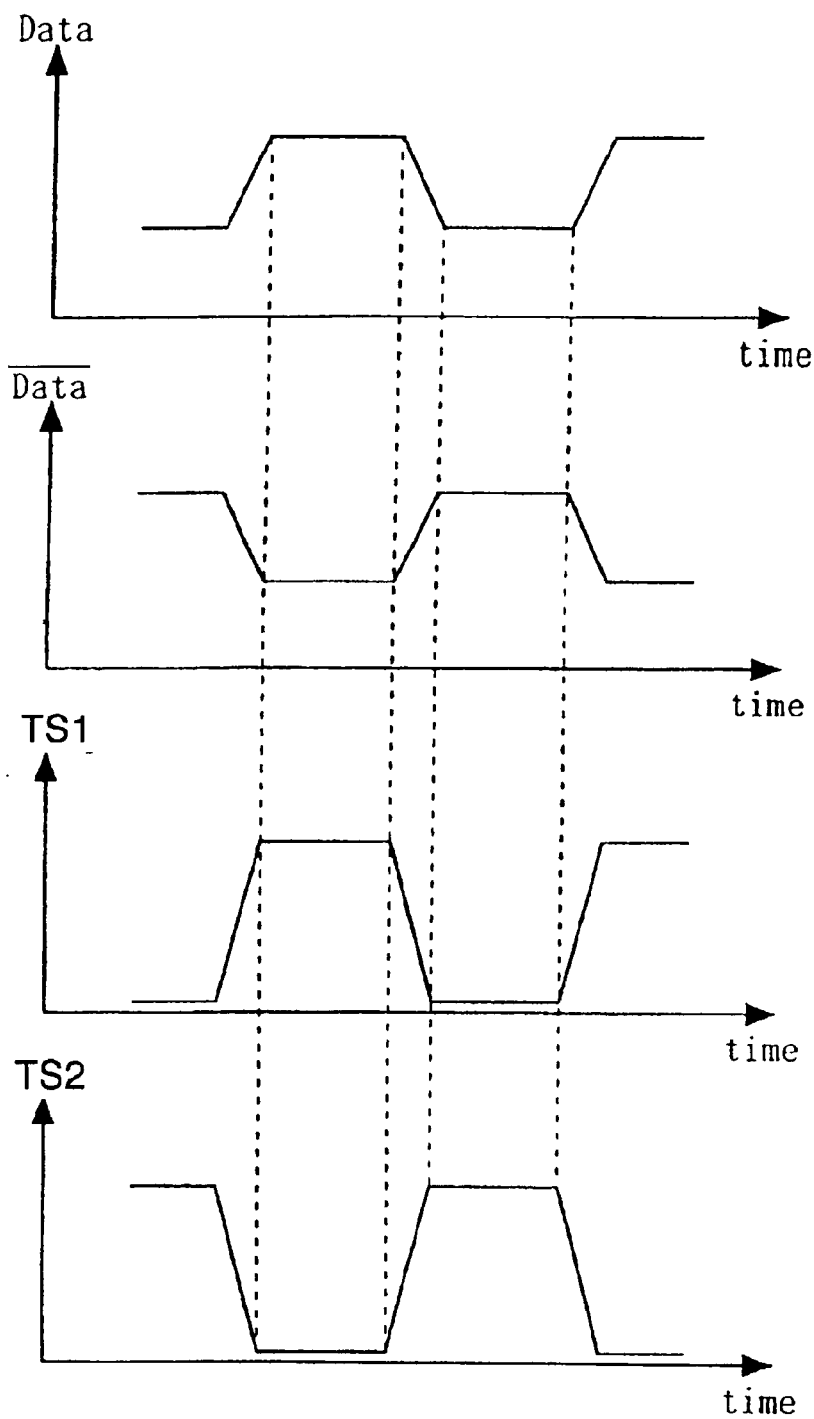
FIG. 13 is a timing chart showing relations among the differential modulation signals Data and $\overline{\text{Data}}$ and timing signals TS1 and TS2.
Figure 14:
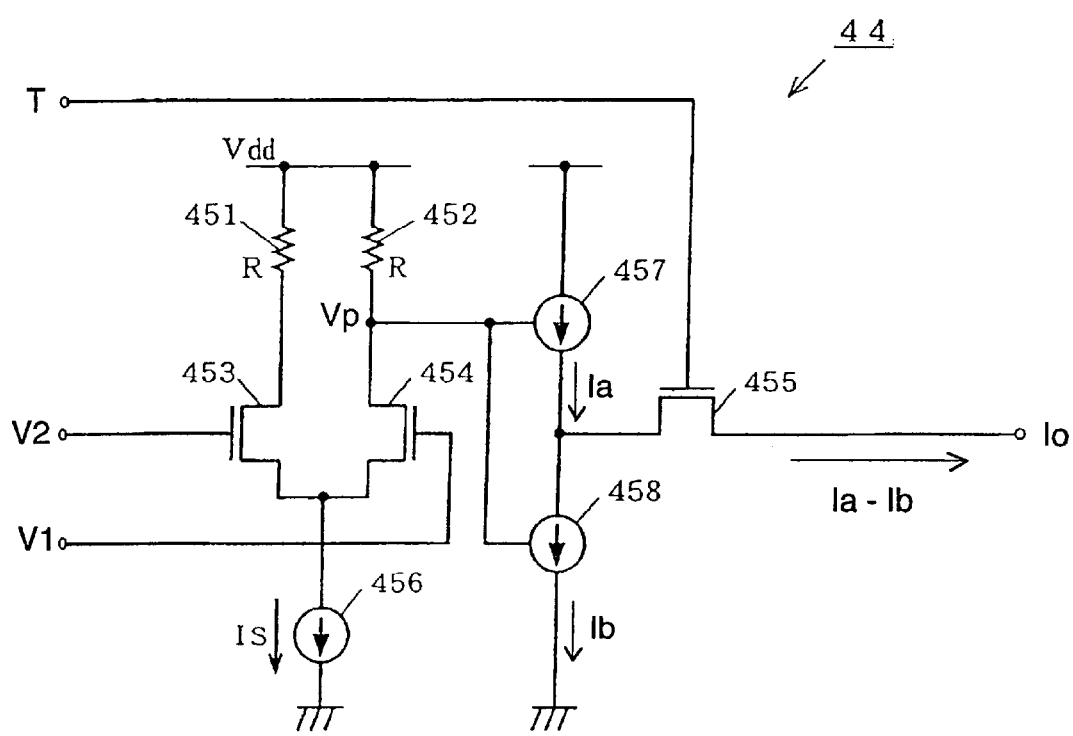
FIG. 14 is a diagram conceptually showing an exemplary arrangement of error current pump (E.C. pump) circuit 45 of the laser diode circuit 100b of FIG. 12.

For this reason, referring to FIGS. 12 through 15, only peak 7 and bottom 7a error detectors are detailed and the description of the remaining portions is limited to the minimum in the following. FIG. 13 is a timing chart showing relations among the modulation signals Data and $\overline{Data}$ and timing signals TS1 and TS2; FIG. 14 is a diagram conceptually showing an exemplary arrangement of error current pump (E.C. pump) circuit 45; and FIG. 15 shows graphs illustrating voltage-to-current characteristics in error current pump circuit 45.

Peak error detector 7 comprises; a timing signal (TS1) generator 44 for generating a timing signal TS1 from the differential input modulation signals Data and $\overline{Data}$; an error current pump (E. C. pump) 45; a capacitor 46; and an amplifier 47. E.C. pump 45 has its timing signal input T connected with the output terminal of TS1 generator 44, its V1 input terminal coupled with the peak reference voltage Vpeak, its V2 input terminal connected with the C/V converter 3 output Vo. Amplifier 47 has its input connected with the output of E.C. pump 45 and one end of capacitor 46 with the other end pulled down to the ground, and its output connected with the control input terminal of current source 83 within modulation current driver 8.

Bottom error detector 7a is identical to peak error detector 7 except that:

(1) detector 7a has timing signal (TS2) generator 44a instead of TS1 generator 44;

(2) detector 7a applies, to the V1 input terminal, the bottom reference voltage Vbottom instead of Vpeak; and (3) detector 7a supplies the amplifier 47 output to the control terminal of current source 91 of bias current driver 9.

In this specific example, it is assumed that the differential modulation signals Data and $\overline{Data}$ are a pair of binary signals which change in a complementary manner between a higher level and a lower but non-zero level both having an identical polarity. An exemplary pair of such differential modulation signals is shown by graphs with respective labels "Data" and "$\overline{Data}$" in FIG. 13. By using the signals Data and $\overline{Data}$, TS1 generator 44 generates a timing signal with the same phase as the signal Data as shown by the third graph labeled "ST1". Similarly, TS2 generator 44a generates a timing signal with the same phase as the signal $\overline{\text{Data}}$ as shown by the last graph labeled "ST2". Each of the timing signals Data and $\overline{\text{Data}}$ is passed to the T input terminal of error current (E.C.) pump circuit 45.

In FIG. 4, error current pump circuit 45 comprises: a differential pair of transistors 453 and 454 having their gates used as input terminals V2 and V1, respectively, and their drains pulled up to Vdd through respective resistors 451 and 452; a current source 456 having its cathode pulled down to the ground and its anode connected with the drains of transistors 453 and 454; serially connected variable current sources 457 and 458 having their control input connected together with the node between resistor 452 and the transistor 454 drain, the anode end thereof pulled up to Vdd and the cathode end thereof pulled down to the ground; and a transistor 455 having its drain terminal connected with the node between serially connected current sources 457 and 458, its gate terminal used as timing input terminal T and its source terminal used as the output terminal Io. Though transistors 35 and 36 are shown as MOS FETs (metal oxide semiconductor field effect transistors), transistors 35 and 36 may be of any suitable type.

Figure 15A:
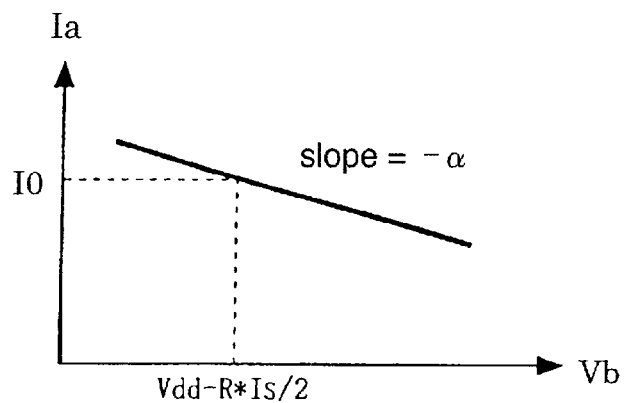
FIG. 15 shows graphs illustrating voltage-to-current characteristics in error current pump circuit 45.
Figure 15B:
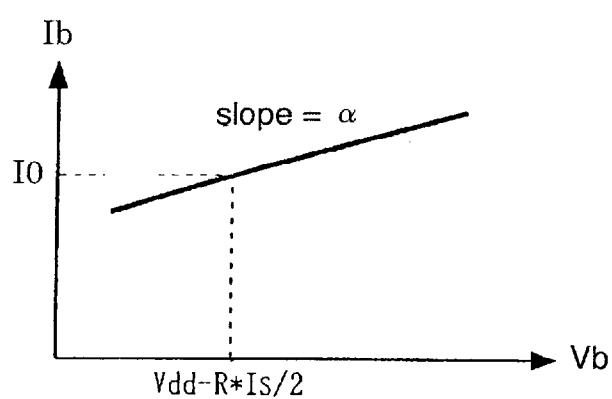

Current source 456 provides a constant current IS. Variable current sources 457 and 458 provide respective variable currents Ia and Ib in response to respective voltages applied to their respective control input terminals. Assuming the gain of the differential amplifier 451–454 to be β, the voltage Vp of the drain of transistor 454 is expressed as Vp=–β (V1–V2). The voltage Vp is supplied to the control input terminals of current sources 457 and 458. The control voltage-to-current characteristics of the current sources 457 and 458 are preferably set as shown in respective FIGS. 15A and 15B, where the axis of abscissa indicates the control voltage Vp and the axes of coordinate indicate currents Ia and Ib flowed by respective current sources 457 and 458. As shown in FIG. 15A, current source 457 is preferably configured to have a Vp-to-Ia characteristic in which a ratio of a voltage change to current change is given as a slope of –α and to flow a current of I0 in magnitude for a voltage Vp equal to Vdd–R·Is/2. The condition that Vp=Vdd–R·Is/2 occurs when V1=V2. Also, as shown in FIG. 15B, current source 458 is preferably configured to have a Vp-to-Ib characteristic in which a ratio of a voltage change to current change is given as a slope of α and to flow a current of I0 in magnitude for a voltage Vp equal to Vdd–R·Is/2. This follows that:

$$Ia = -\alpha Vp + I0 + \alpha Vp0, \text{ and}$$

$$Ib = \alpha Vp + I0 - \alpha Vp0,$$

where Vp0=Vdd–R·Is/2.

The transistor 455 is turned on and off by the timing signal T. Thus, if transistor 455 is turned on, then the current Io flowing through transistor 455 is expressed as:

$$\begin{aligned} I_o &= Ia - Ib \\ &= -2\alpha Vp + 2\alpha Vp0 \\ &= 2\alpha\beta(V1 - V2) + 2\alpha Vp0 \end{aligned} \quad (4)$$

It is noted that the symbols Ia and Ib indicates the magnitude when respective currents flow towards the ground, and the symbol Io indicates the magnitude when the current flows from drain to source of transistor 455 as shown in FIG. 15. As described above, if it is assumed that when V1=V2, Vp equals Vdd–R·Is/2 (=Vp0), then Vp0 is zero. In this case, the expression (4) is rewritten as:

$$Io = 2\alpha\beta(V1 - V2) \quad (5)$$

Figure 15C:
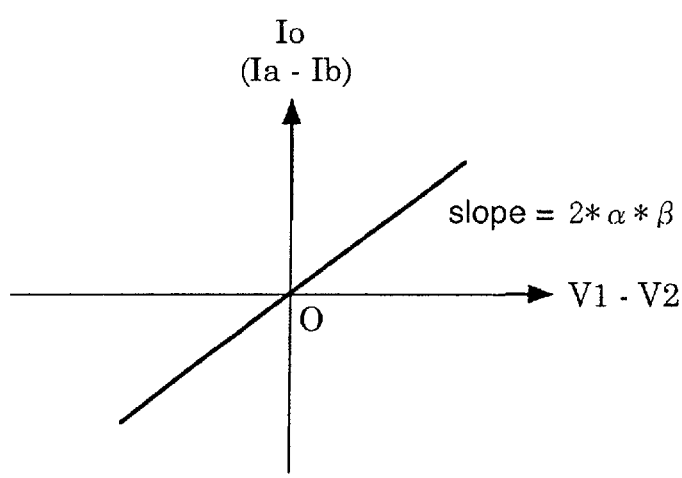

In the following discussion, we assume that transistor 455 is conductive. Then, transistor 455 lets the current Io flow as shown in FIG. 15. As seen from FIG. 15C, when V1=V2, the transistor 455 source current (or the output current) Io becomes zero. If V1 is smaller that V2, then since Io becomes negative, the output current Io flows out of error current pump 45 to charge capacitor 46, which increases the voltage across the capacitor 46. Conversely, if V1 is larger that V2, then since Io becomes positive, the output current Io is drawn into error current pump 45 to discharge capacitor 46, which decreases the voltage across the capacitor 46. This voltage is amplified by amplifier 47 and then used as a feedback signal.

The above described operation is executed in each 7 of peak and bottom 7a error detectors.

According to this illustrative embodiment of the invention, a laser diode circuit 100b can converge the C/V converter 3 output Vo to the target voltages Vpeak and Vbottom in a constant period of time regardless of the difference between Vo and Vpeak or between Vo and Vbottom. Further, the convergence period can be set smaller.

Figure 16:
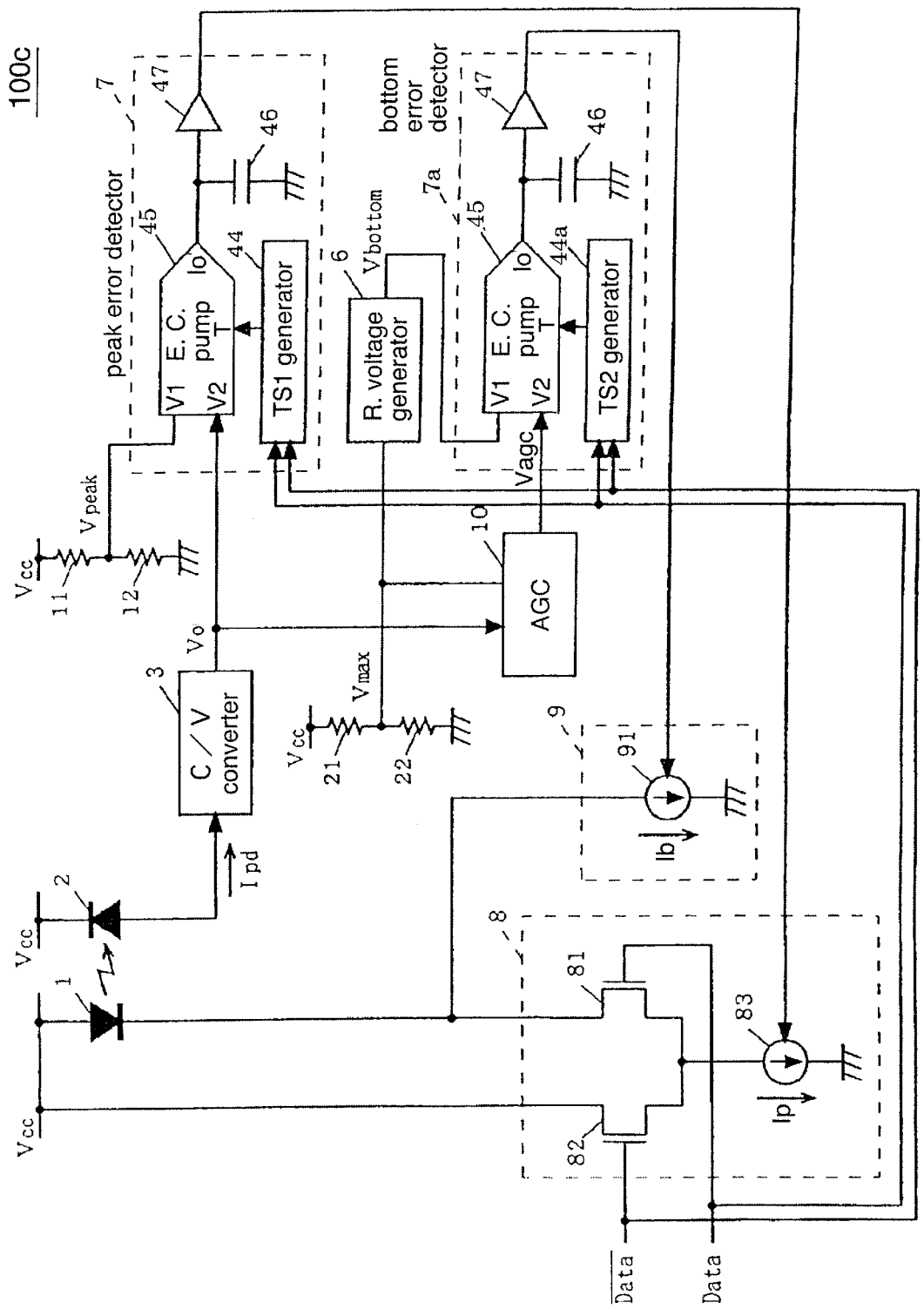
FIG. 16 is a diagram conceptually showing an exemplary arrangement of a laser diode circuit 100c according to a fourth illustrative embodiment of the invention.

FIG. 16 is a diagram conceptually showing an exemplary arrangement of a laser diode circuit 100c according to a fourth illustrative embodiment of the invention. Further referring FIGS. 9 and 12, it is seen that laser diode circuit 100c of FIG. 16 can be obtained by adding the voltage divider (21 and 22) for Vmax and the AGC circuit 10 to the laser diode circuit 100b of FIG. 12. Accordingly, laser diode circuit 100c has both advantages that laser diode circuits 100a and 100b have.

Many widely different embodiments of the present invention may be constructed without departing from the spirit and scope of the present invention. It should be understood that the present invention is not limited to the specific embodiments described in the specification, except as defined in the appended claims.

What is claimed is:

1. A laser diode system for emitting a predetermined optical power in response to an input binary signal, the laser diode system comprising:

a laser diode, responsive to a driving current applied thereto, for emitting an optical power;

bias means for always providing said laser diode with a bias current of a magnitude responsive to a bias control signal;

driving means, responsive to a predetermined level of said input binary signal, for providing a radiation current of a magnitude responsive to a radiation control signal so as to feed said laser diode with said bias current and said radiation current simultaneously;

means for providing a detected signal proportional to said optical power from said laser diode;

means for supplying said driving means with said radiation control signal so as to cause a peak level of said detected signal to match a first constant reference voltage, said first constant reference voltage being such that a simultaneous application of said bias and radiation currents to said laser diode causes said laser diode to emit said predetermined optical power;

means for generating a second constant reference voltage from said first constant reference voltage; and means for supplying said bias means with said bias control signal so as to cause a bottom level of said detected signal to match said second constant reference voltage, said second constant reference voltage being such that said bias current causes said laser diode to emit no laser.

2. A laser diode system as defined in claim 1, wherein said means for generating a second constant reference voltage comprises means for generating said second constant reference voltage higher than a lower limit of said detected signal by an appropriate amount.

3. A laser diode system as defined in claim 2, wherein said second constant reference voltage is given by:

$$Voffset+\beta(Vpeak-Voffset)$$

where Vpeak is said first constant reference voltage, Voffset is said lower limit of said detected signal, and $\beta$ is a factor for determining said appropriate amount.

4. A laser diode system as defined in claim 3, wherein said factor $\beta$ is 1/n, where a quotient of a maximum optical power of said laser diode divided by a minimum optical power of said laser diode equals n.

5. A laser diode system as defined in claim 3, wherein said means for generating a second constant reference voltage includes means for controlling said factor $\beta$, said $\beta$ controlling means including a differential pair of transistors, wherein said factor $\beta$ is proportional to a difference between voltages applied to control terminals of said differential pair of transistors.

6. A laser diode system as defined in claim 1, wherein means for supplying said radiating means comprises:

pump means for trying to flow a current proportional to said first constant reference voltage minus said detected signal, a positive direction of said current being toward external and a negative direction of said current being toward internal;

a capacitor charged by said current when said current is said positive direction and discharged by said current when said current is said negative direction;

means, disposed between said pump means and said capacitor and responsive only to a predetermined level of said input binary signal, for permitting said current to flow and, otherwise, electrically disconnect a path which said current flows through; and means for supplying said radiating means with an amplified version of the voltage across said capacitor.

7. A laser diode system as defined in claim 1, wherein said means for supplying said bias means comprises:

pump means for trying to flow a current proportional to said second constant reference voltage minus said detected signal, a positive direction of said current being toward external and a negative direction of said current being toward internal;

a capacitor charged by said current when said current is said positive direction and discharged by said current when said current is said negative direction;

means, disposed between said pump means and said capacitor and responsive only to a predetermined level of said input binary signal, for permitting said current to flow and, otherwise, electrically disconnect a path which said current flows through; and means for supplying said bias means with an amplified version of the voltage across said capacitor.

8. A laser diode system as defined in claim 6, wherein said pump means comprises:

means for providing an amplified voltage proportional to said first constant reference voltage minus said detected signal;

a pair of serially connected first and second variable current sources, said first current generating a first current which linearly decreases with an increase of said amplified voltage, and said second current generating a second current which flows in the same direction as said first current and which linearly increases at the same rate as said first current with an increase of said amplified voltage; and said path being connected with the node between said first and second current sources.

9. A laser diode system as defined in claim 7, wherein said pump means comprises:

means for providing an amplified voltage proportional to said second constant reference voltage minus said detected signal;

a pair of serially connected first and second variable current sources, said first current generating a first current which linearly decreases with an increase of said amplified voltage, and said second current generating a second current which flows in the same direction as said first current and which linearly increases at the same rate as said first current with an increase of said amplified voltage; and said path being connected with the node between said first and second current sources.

10. A laser diode system for emitting a predetermined optical power in response to an input binary signal, the laser diode system comprising:

a laser diode, responsive to a driving current applied thereto, for emitting an optical power;

bias means for always providing said laser diode with a bias current of a magnitude responsive to a bias control signal;

driving means, responsive to a predetermined level of said input binary signal, for providing a radiation current of a magnitude responsive to a radiation control signal so as to feed said laser diode with said bias current and said radiation current simultaneously;

means for providing a detected signal proportional to said optical power from said laser diode;

means for supplying said driving means with said radiation control signal so as to cause a peak level of said detected signal to match a first constant reference voltage, said first constant reference voltage being such that a simultaneous application of said bias and radiation currents to said laser diode causes said laser diode to emit said predetermined optical power;

means for generating a second constant reference voltage from a maximum constant reference voltage;

means for providing a scaled version of said detected signal such that a peak level of said scaled version constantly matches said maximum constant reference voltage; and means for supplying said bias means with said bias control signal so as to cause a bottom level of said scaled version of said detected signal to match said second constant reference voltage, said second constant reference voltage being such that said bias current causes said laser diode to emit no laser.

11. A laser diode system as defined in claim 10, wherein said means for providing a scaled version of said detected signal includes:

means for amplifying said detected signal to provide an output voltage expressed as Voffset+β(Vo−Voffset), where Vo is said detected signal, Voffset is a lower limit of said detected signal, and β is an amplification factor thereof;

means for controlling said factor β, said β controlling means including a differential pair of transistors, wherein said factor β is proportional to a difference between control voltages applied to control terminals of said differential pair of transistors; and means for supplying said β controlling means with said control voltages such that a peak level of said output voltage constantly matches said maximum constant reference voltage.

12. A laser diode system as defined in claim 10, wherein said means for generating a second constant reference voltage comprises means for generating said second constant reference voltage higher than a lower limit of said detected signal by an appropriate amount.

13. A laser diode system as defined in claim 12, wherein said second constant reference voltage is given by:

$$Voffset+\beta(Vmax-Voffset)$$

where Vmax is said maximum constant reference voltage, Voffset is said lower limit of said detected signal, and β is a factor for determining said appropriate amount.

14. A laser diode system as defined in claim 13, wherein said factor β is 1/n, where a quotient of a maximum optical power of said laser diode divided by a minimum optical power of said laser diode equals n.

15. A method of driving a laser diode so as to cause the laser diode to emit a predetermined optical power in response to an input binary signal in a system including: said laser diode, responsive to a driving current applied thereto, for emitting an optical power; and a photodiode, optically coupled with said laser diode, for generating a photo-current proportional to said optical power from said laser diode, the method comprising the steps of:

always providing said laser diode with a bias current of a magnitude responsive to a bias control signal;

in response to a predetermined level of said input binary signal, providing a radiation current of a magnitude responsive to a radiation control signal so as to feed said laser diode with said bias current and said radiation current simultaneously;

providing a detected signal proportional to said photo-current;

providing said radiation control signal so as to cause a peak level of said detected signal to match a first constant reference voltage, said first constant reference voltage being such that a simultaneous application of said bias and radiation currents to said laser diode causes said laser diode to emit said predetermined optical power;

generating a second constant reference voltage from said first constant reference voltage; and providing said bias control signal so as to cause a bottom level of said detected signal to match said second constant reference voltage, said second constant reference voltage being such that said bias current causes said laser diode to emit no laser.

\* \* \* \* \*